(12) United States Patent
Shimura

(10) Patent No.: US 7,182,481 B2
(45) Date of Patent: Feb. 27, 2007

(54) LIGHTING APPARATUS

(75) Inventor: Takashi Shimura, Fujiyoshida (JP)

(73) Assignee: Citizen Electronics Co. Ltd, Yamanashi (JP)

( * ) Notice: Subject to any disclaimer, the term of this patent is extended or adjusted under 35 U.S.C. 154(b) by 36 days.

(21) Appl. No.: 11/076,438

(22) Filed: Mar. 10, 2005

(65) Prior Publication Data

US 2005/0201109 A1 Sep. 15, 2005

(30) Foreign Application Priority Data

Mar. 10, 2004 (JP) .......................... P2004-068167

(51) Int. Cl.
*F21V 5/00* (2006.01)

(52) U.S. Cl. .................. 362/244; 362/237; 362/240; 362/330

(58) Field of Classification Search ............... 362/237, 362/240, 243–245, 311, 326, 327, 330, 336, 362/337, 339, 800; 359/741–743
See application file for complete search history.

(56) References Cited

U.S. PATENT DOCUMENTS

| 6,987,613 | B2 * | 1/2006 | Pocius et al. | 359/565 |
| 7,019,334 | B2 * | 3/2006 | Yatsuda et al. | 257/98 |
| 2004/0084681 | A1 * | 5/2004 | Roberts | 257/79 |
| 2005/0286145 | A1 * | 12/2005 | Silhengst et al. | 359/742 |

FOREIGN PATENT DOCUMENTS

JP 09062206 A 3/1997

* cited by examiner

*Primary Examiner*—Laura K. Tso
(74) *Attorney, Agent, or Firm*—Browdy and Neimark, PLLC

(57) ABSTRACT

A lighting apparatus comprising a support, a light source having an emission surface and disposed in the support, a lens disposed to face the emission surface of the light source, and a half-mirror film provided on at least a surface of the lens, the half-mirror film being a thin film comprising a metallic material such as aluminum, the lens being a light-focusing lens, the lens having a peripheral part and a central part, the peripheral part including a lens surface comprising a smoothly curved surface, and the central part including a Fresnel lens surface.

15 Claims, 6 Drawing Sheets

LIGHTING APPARATUS

CROSS-REFERENCE TO THE RELATED APPLICATION

The application claims the priority benefit of Japanese Patent Application No. 2004-68167, filed on Mar. 10, 2004, the entire descriptions of which are incorporated herein by reference.

BACKGROUND OF THE INVENTION

1. Field of the Invention

The present invention relates to a lighting apparatus in which light source(s) such as LED(s) and a light-focusing lens are combined.

2. Related Art Statement

Conventionally, many of lighting apparatuses used for reading and writing CDs, DVDs or used as a backlight system in various optical applications include a support, a light source such as an LED, lamp or the like attached to the support, a lens attached to or formed integrally with the support to face the light source, and are configured to illuminate brightly a predetermined object or scope so as to have a predetermined property to focus light emitted from the LED and so on.

FIG. 9 illustrates a first conventional lighting apparatus. The lighting apparatus has a frame-like support 40, a chip-shaped LED 41 disposed in the support, and a lens 42 supported on the support 40 so as to face the LED. The lens 42 comprises a semi-spherical transparent member, and has a regular convex lens surface 42a. An emission surface (usually, an upper surface) of the LED 41 is disposed in the vicinity of a focal position of the lens 42 or in a position remote from the focal position appropriately. The LED 41 is mounted on a substrate 43 attached to the support 40 and supplied with an electrical power for emission through bonding wires 44. Meanwhile, the LED 41 and the bonding wires 44 are encapsulated by a sealing member 45, which comprises a transparent resin.

However, in the first conventional lighting apparatus, because the lens has a semi-spherical shape, the entire thickness of the lighting apparatus increases. Therefore, a lens having a Fresnel lens surface possible to thin a thickness is often used in place of the lens 42. Here, the Fresnel lens surface means a surface which comprises a convex lens part at the center thereof and a series of coaxial fine prisms each having a right triangle-like shape in section formed coaxially to a central axis of the convex lens. In such a lens, when the ring-like prismatic portions are equal in height in order to minimize the entire thickness, an inclined surface of each prismatic portion rises up as going to a peripheral part of the lens, an apex angle of each prismatic portion becomes sharp, a radial space between the adjacent prismatic portions also becomes narrow rapidly. Accordingly, when a transparent member made of a usual resin material is formed by cutting directly or a forming die, the manufacturing of the peripheral part of the lens is very difficult.

When the LED is located on an optical axis of the lens, a beam of light enters bottom surfaces of the prismatic portions obliquely at the peripheral part of the lens, only a portion (lower portions) of the inclined surfaces of the prismatic portions is usable, hence the usability is lower. Under such circumstances, it is difficult to manufacture a lens including a Fresnel lens surface having a large aperture prefer to collect light, in which a ratio of an outer diameter to a focal distance in the lens is larger and the inclined surface of each prismatic portion at the peripheral part is sharp, the performance also has no advantage over the usual lens.

On the other hand, if the LED 41 is used keeping a natural luminescent color, the structure shown in FIG. 9 is sufficient for the lighting apparatus, while if a light source color different from the luminescent color of the LED 41 is used, for example, when a white light source is desired to obtain by use of a blue color-emission LED, by using a material containing a YAG fluorescent substance into the transparent sealing member 45 for sealing the LED 41, the white color emission can be acquired as a whole by exciting the fluorescent substance according to the emission of the blue-color LED 41 to generate light having a long wave length, and by a color mixture of the LED emission and the sealing member emission.

In this case, when the LED does not emit the light and a person watches the sealing member 45 through the transparent lens 42 from the outside, the person can see the sealing member 45 taken on yellow tinge by outside light, because the fluorescent substance is included in the sealing member 45. This results in damage of an exterior appearance of the lighting apparatus.

To improve the defect, in a second conventional lighting apparatus, a light-scattering plate 46 is disposed in a front of the LED 41 in place of the lens 42, as shown in FIG. 10. The light-scattering plate 46 presents white color scattering outside light, has an effect that the back yellow sealing member 45 does not see almost. However, because the emitted light from the LED 41 is also scattered in the structure, even if a light-focusing lens is used, it is not possible to collect light, or the lighting apparatus becomes incomplete.

SUMMARY OF THE INVENTION

Therefore, a main object of the present invention is to provide a lighting apparatus in which the inside or structure of the lighting apparatus cannot be seen through it from the outside when electricity is not applied to the lighting apparatus, maintaining the quality of the outer appearance and also the light-focusing power of the lens used in the lighting apparatus.

Another object of the present invention is to provide a lighting apparatus decreasing in thickness and easier manufacturing processes of the lens having a great aperture.

Still another object of the present invention is to provide a lighting apparatus having a lot of flexibilities in a lens design used in the apparatus.

According to an embodiment of the present invention, a lighting apparatus comprises a support, a light source disposed in the support and having an emission surface, a lens disposed to face the emission surface of the light source, and a light-shielding mechanism provided on at least one surface of the lens.

In one embodiment, the light shielding mechanism includes a half-mirror film. The light source comprises a blue-light-emitting diode encapsulated by a transparent sealing member containing YAG fluorescent material(s) and is adapted to emit white light to the outside. In another embodiment, the light source comprises a plurality of LEDs, which are adapted to emit light of same or different colors with respect to each other. The light-shielding mechanism prevents viewing of the inside of the lighting apparatus from the outside using external light when light is not being emitted from the light source.

According to another embodiment, a lighting apparatus comprises a support, a light source disposed in the support and having an emission surface and a lens disposed to face the emission surface of the light source. The lens comprises a light-focusing lens. The lens has a peripheral part and a central part, the peripheral part includes a convex lens surface comprising a smoothly curved surface, and the central part includes a Fresnel lens surface. A central axis the Fresnel lens surface and a focal position of the lens comprising the smoothly curved surface are disposed in different positions.

DETAILED DESCRIPTION OF THE PREFERRED EMBODIMENTS

Preferred embodiments of the present invention will be explained with reference to the accompanying drawings below.

Figure 1:
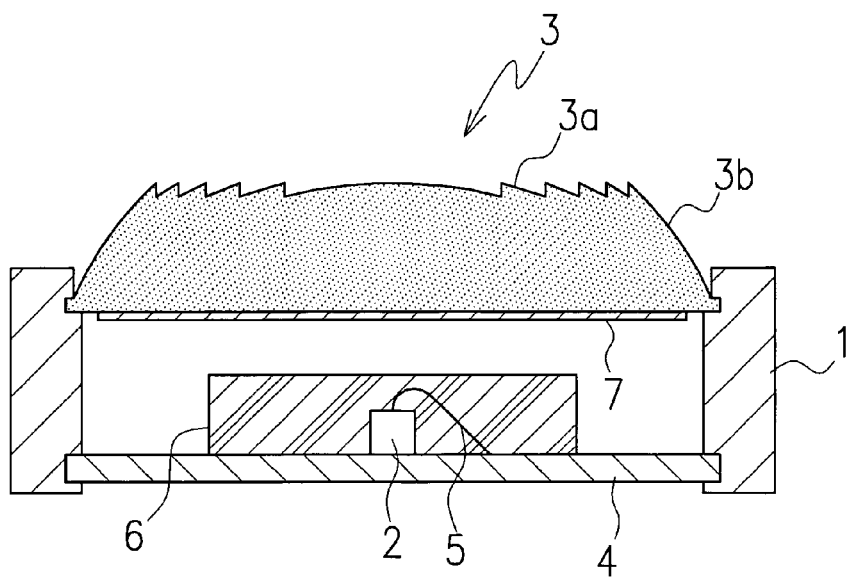
FIG. 1 is a sectional view showing a first embodiment of a lighting apparatus according to the present invention.
Figure 2:
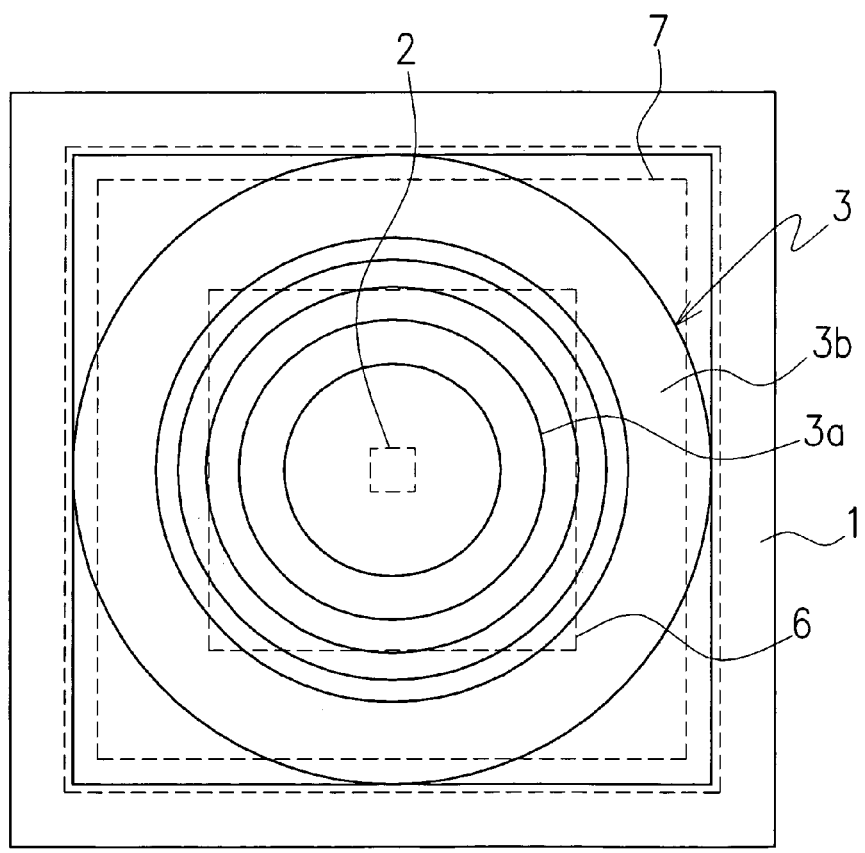
FIG. 2 is a plan view showing the first embodiment of the lighting apparatus according to the present invention.

FIGS. 1 and 2 illustrate a first embodiment for a lighting apparatus according to the present invention. The lighting apparatus in the first embodiment comprises, for example, a generally rectangular-shaped support 1, a light source 2 disposed in the support 1, and a lens 3 supported on the support 1 to face the light source 2.

The light source 2 comprises an LED in the embodiment. The LED is mounted on a substrate 4, which is fixed to the support 1 by any means. The LED, as the light source 2, is connected through bonding wires 5 with an exterior power source device (not shown). Meanwhile, it is also to execute electrical continuity to an exterior power source device through bumps in place of the bonding wires 5.

The LED and the bonding wires 5 are encapsulated by a sealing member 6. The sealing member 6 is made of a transparent resin containing a YAG fluorescent material in an example.

The lens 3 has a Fresnel lens surface 3a formed on a surface of the lens, that is for example, a central part of an upper surface thereof, a smoothed lens surface 3b formed on a peripheral part of the lens. The lens surface 3b is formed in a smoothly continuously curved surface, for example, a spherical surface. In addition, a lower surface of the lens 3, that is to say, a surface thereof facing the LED is flat.

A light-shielding mechanism is provided on the lens 3. The light-shielding mechanism is provided on at least one surface of the lens 3, for example, the flat lower surface of the lens 3. The light-shielding mechanism acts to prevent viewing of the inside of the lighting apparatus from the outside using external light when light is not being emitted from the light source.

The light-shielding mechanism comprises a half-mirror film 7, for example. The half-mirror film 7 comprises a thin film made of a metal such as aluminum or silver and is provided on the lower surface of the lens 3 by any means such as vacuum deposition. In FIG. 1, a thickness of the thin film is shown enlargedly. The half-mirror film 7 acts as a semi-transparent reflecting film.

When viewing the lighting apparatus in the embodiment under the outside light, the half-mirror film 7 reflects the outside light, because the reflected light enters the eyes of a viewer. Therefore, the viewer can not completely see through the lens 3 and the inside of the lighting apparatus, with the sealing member 6 and so on, lying behind the lens 3. Half-mirror film 7, in a precise sense, has 50-percent transmission and 50-percent reflection.

A half-mirror film 7 used for this present invention, however, does not need such a high reflectance. If the outer appearance of LED 2 is emphasized, a half-mirror film 7 having 30-to-35-percent reflectance may be available. If the output of light emitted from LED 2 is emphasized, a half-mirror film 7 having 25-to-20-percent or less reflectance may be available. A half-mirror film 7 having 20-to-35-percent reflectance may be considered to use for the present invention, and the reflectance of the half-mirror film 7 may be changed, depending on a convenience of an embodiment. As a result of some tests, when a half-mirror film 7 having around 30-percent reflectance is used for the present invention, the best-balanced effect in a correlation with light efficiency and the outer appearance is achieved.

Figure 3:
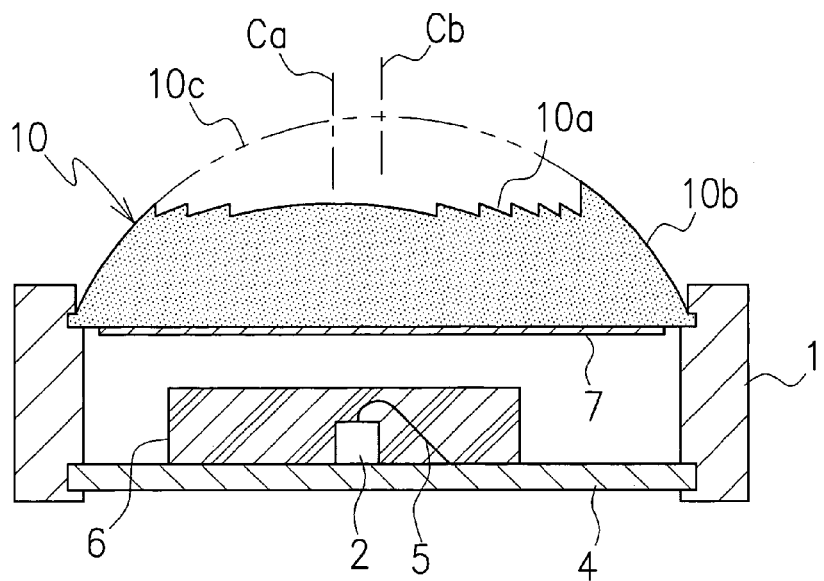
FIG. 3 is a sectional view showing a second embodiment of the lighting apparatus according to the present invention
Figure 4:
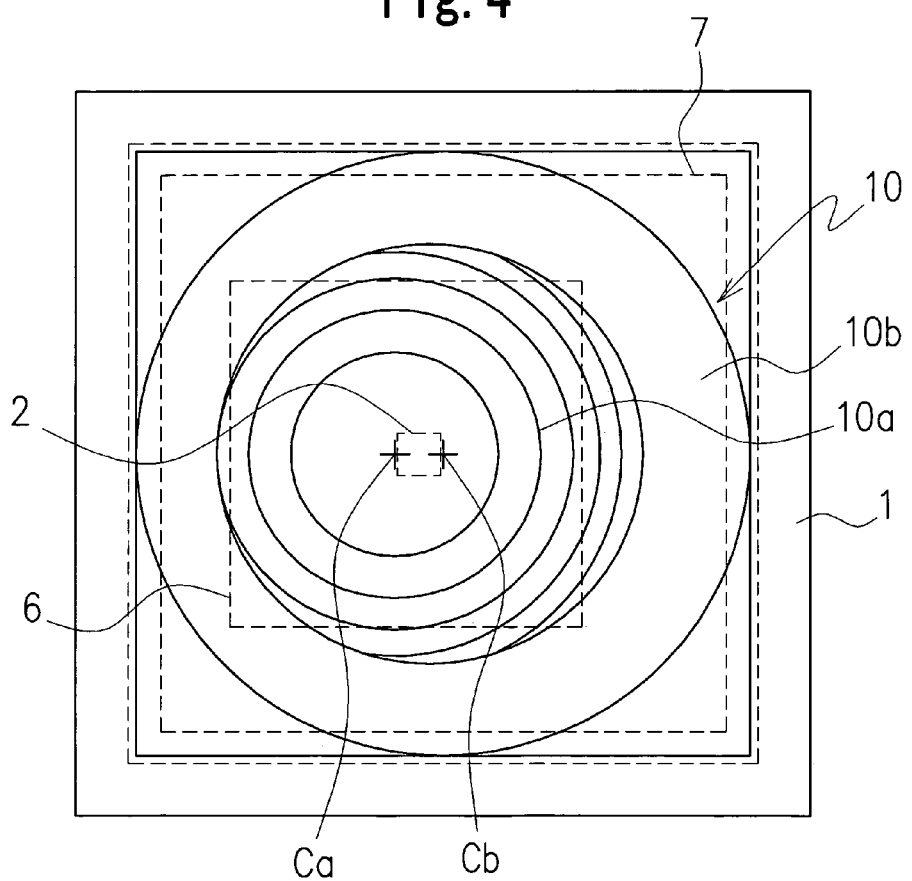
FIG. 4 is a plan view showing the second embodiment of the lighting apparatus according to the present invention.

FIGS. 3 and 4 illustrate a second embodiment of the lighting apparatus according to the present invention.

The lighting apparatus in the second embodiment is the same as the first embodiment in the basic structure and the operation, but it includes a lens 10 having a structure slightly different from that of the lens 3. The lens 10 has a Fresnel lens surface 10a provided on a central part of the lens and a smoothed lens surface 10b provided on a peripheral part of the lens, similarly as the lens 3. However, the lens 10 differs from the lens 3 in that a central axis or optical axis Ca of the Fresnel lens surface 10a deviates slightly from a central axis or optical axis Cb of the lens surface 10b corresponding to a portion of a virtual lens surface 10c. In addition, a central axis of an emission surface of the light source or LED deviates from the central axes Ca and Cb of the Fresnel lens surface 10a and the lens surface 10b. Alternatively, the central axis of the emission surface may be arranged to align with either one of the central axes Ca and Cb.

With such a structure, the emitted light from the LED 2 is collected in different places by the Fresnel lens and lens surfaces 10a and 10b, thereby it is possible to give intentional variation to a pattern of an illumination intensity at a position of an object to be illuminated.

Figure 5:
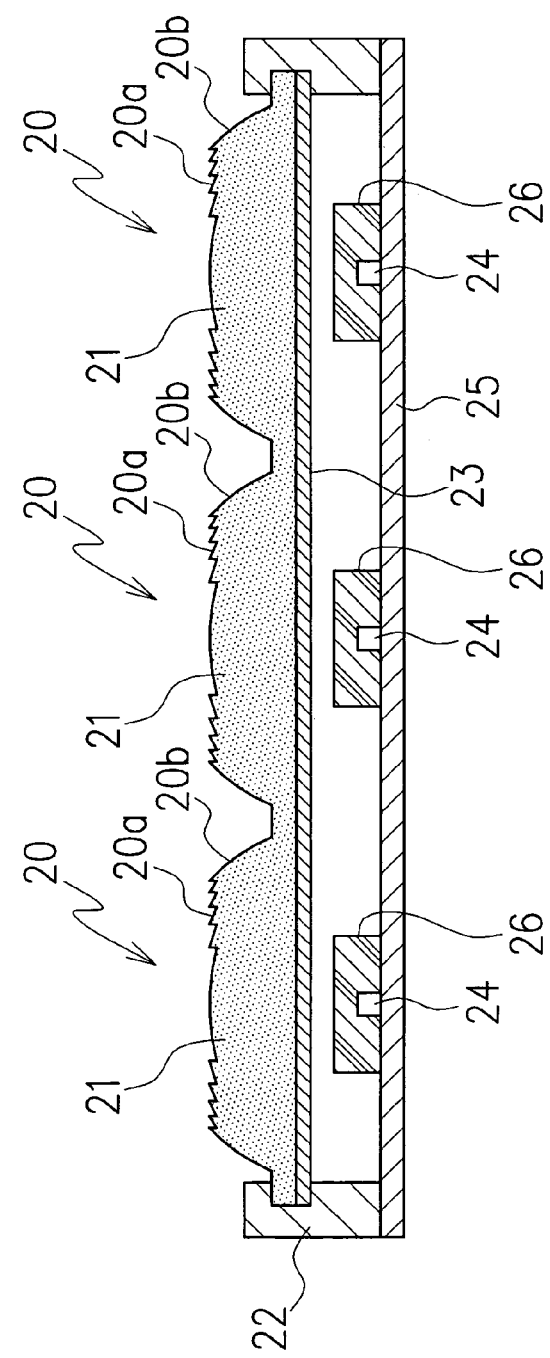
FIG. 5 is a sectional view showing a third embodiment of the lighting apparatus according to the present invention.
Figure 6:
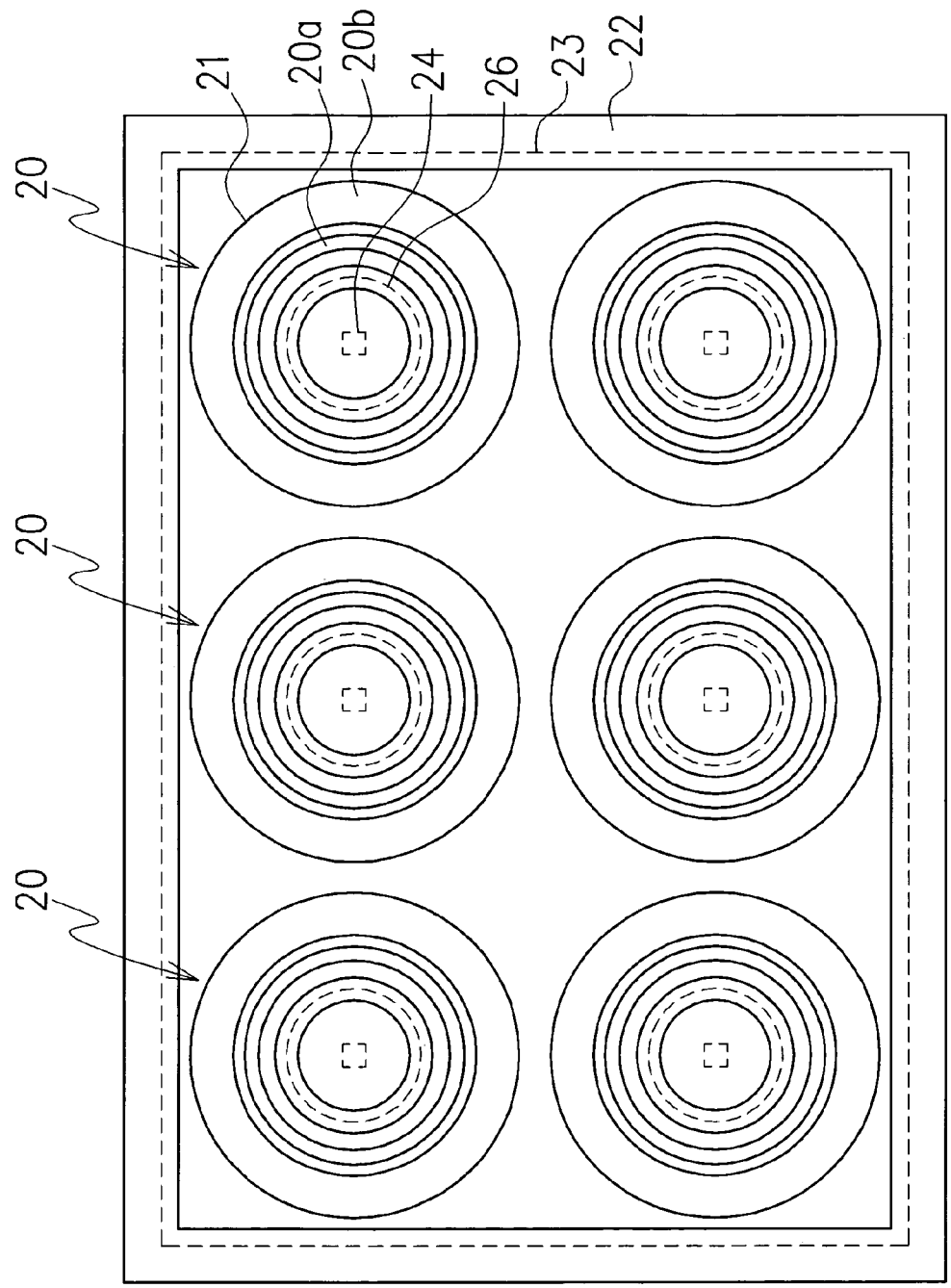
FIG. 6 is a plan view showing the third embodiment of the lighting apparatus according to the present invention.

FIGS. 5 and 6 illustrate a third embodiment of the lighting apparatus according to the present invention.

A plurality of lighting mechanisms 20, which are arranged in a planar state, are used in the embodiment. Each of the lighting mechanisms 20 has a structure similar to the lighting apparatus in the first embodiment as shown in FIG. 1. The number of the lighting mechanisms is optionally determined. Lenses 21 in each of the plurality of lighting mechanisms 20 are formed integrally with respect to each other to form a lens assembly. The lens assembly is supported on the support 22. Each lens 21 has a Fresnel lens surface 20a and a lens surface 20b, similarly to the lens 3. A half-mirror film 23 is provided on a lower surface of the lens assembly of the lenses 21 throughout the whole of the lower surface. A lower surface of each of the lenses 21 forms a plane which faces chip-like LEDs, as light sources. These LEDs 24 are mounted on a larger substrate 25. In addition, the LEDs 24 are encapsulated by sealing members 26 similar to the first embodiment, respectively.

In the embodiment, aligned illumination light can be acquired, and illumination effect having a uniform brightness can be acquired throughout a wider area, if a spot of strong light does not occur at a position of an object to be illuminated by selecting a focal position of each lens 21. In addition, a variation can be given to a light distribution, depending on the objects to be illuminated, and a light-focusing power of the lens depending on the intended use can be obtained, by biasing a position of each LED 24 from a center of each lens 21 on a plane, in the structure of the lighting apparatus.

Figure 7:
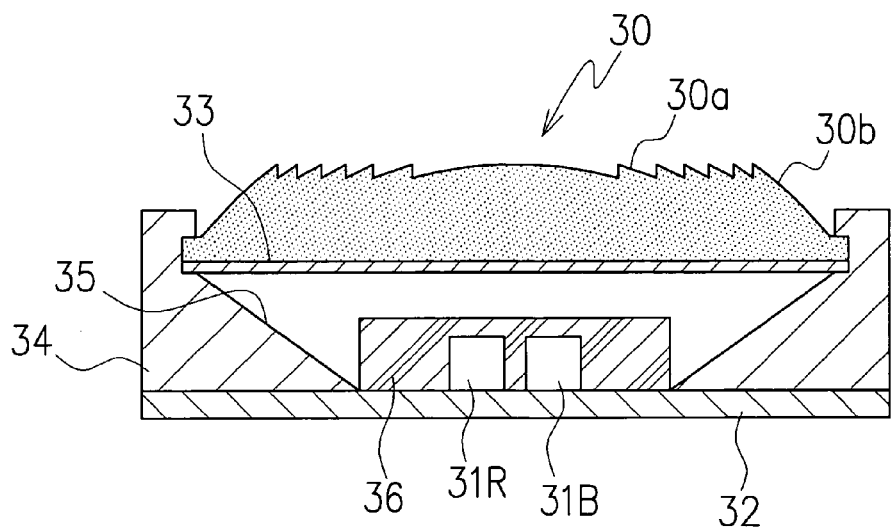
FIG. 7 is a sectional view showing a fourth embodiment of the lighting apparatus according to the present invention.
Figure 8:
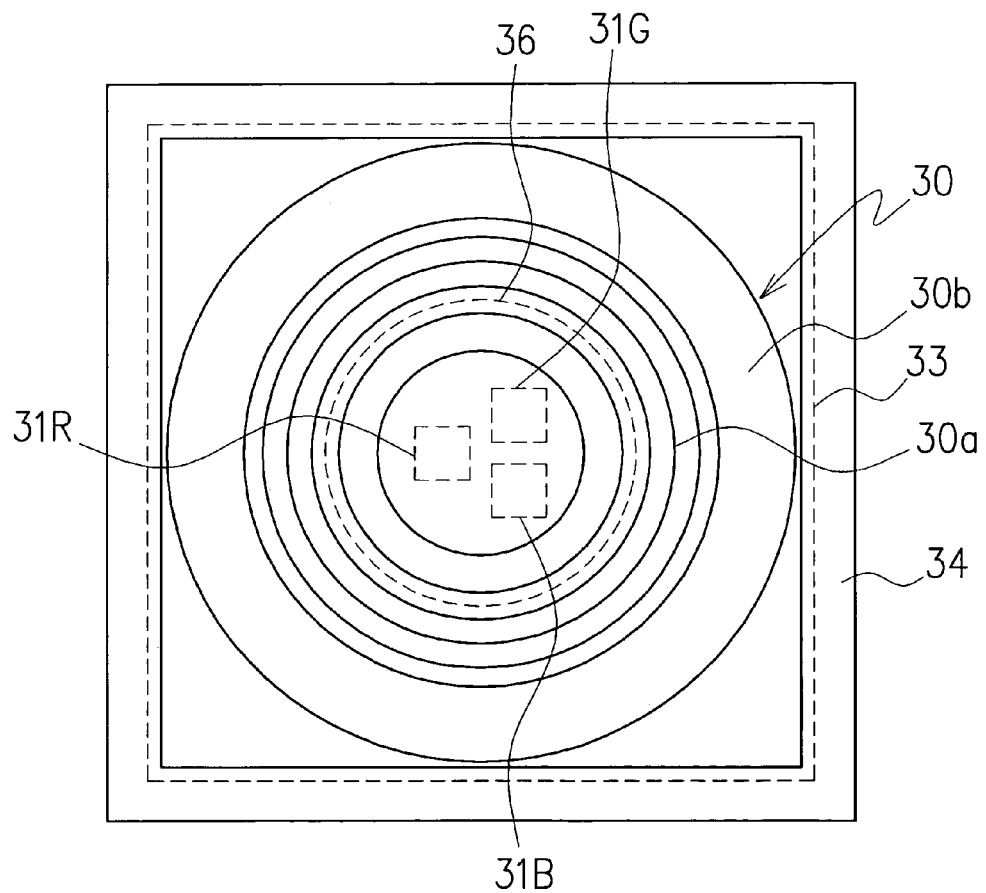
FIG. 8 is a plan view showing the fourth embodiment of the lighting apparatus according to the present invention.
Figure 9:
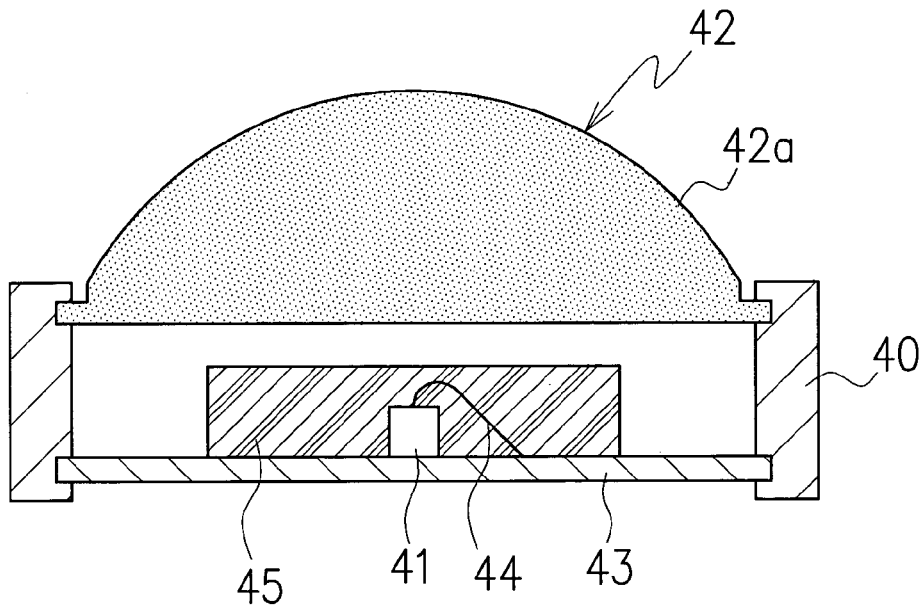
FIG. 9 is a sectional view showing a first conventional lighting apparatus.
Figure 10:
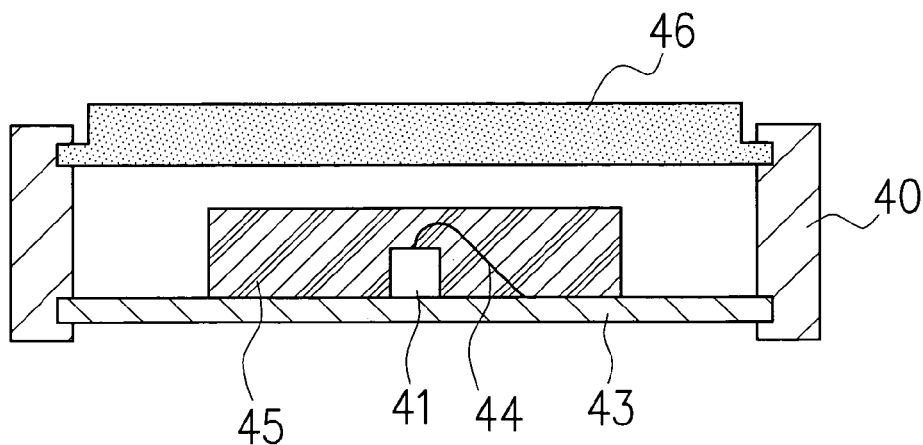
FIG. 10 is a sectional view showing a second conventional light apparatus.

FIGS. 7 and 8 illustrate a fourth embodiment of the lighting apparatus according to the present invention.

In the lighting apparatus shown in the embodiment, a plurality of LEDs 31R, 31G and 31B are disposed below one lens 30. The lens 30 has a Fresnel lens surface 30a and a lens surface 30b. In order to form mixed illumination light with three original colors of red, green and blue, for example, the LEDs 31R, 31G and 31B each emitting original color light are disposed close to each other and mounted on a substrate 32 (see FIG. 8). A half-mirror film 33 is provided on a lower surface of the lens 30. Meanwhile, a conical or pyramidal reflecting surface 35 may be provided on the support 34 in the lighting apparatus in order to employ light-emission in all directions effectively. A surface treatment increasing a reflection coefficient is provided on the reflecting surface 35.

In the embodiment, a structure in which the sealing member 36 for sealing the LEDs 31R, 31G and 31B does not include the fluorescent material or a structure without a sealing member is used is often used. Also, in that case, the half-mirror film 33 has an effect that the viewer cannot see easily an inside structure of the lighting apparatus. Diffused illumination light can be obtained by using a plurality of LEDs emitting the same colors, respectively.

Although the preferred embodiments of the present invention have been described, the present invention is not limited to these embodiments only. For example, the configuration and the disposition for the LED(s) corresponding to the light source, the material and the color for the half-mirror film, the structure and the like of the substrate, the support or a vessel in place of the support can be set optionally. Moreover, although the half-mirror film is provided on the lower surface of the lens facing the LED, it may be provided on the Fresnel lens surface, for example. The thickness of the half-mirror film is also selected optionally to allow the reflection and transmission ratios to be set suitably. The half-mirror film may not be provided on the lower surface of the lens entirely and uniformly, a dot-like shape, blind-like shape, lattice-like shape or the like may be formed for the half-mirror film. The presence or absence of the sealing member, a color or shape of the sealing member and the like can also be set optionally. In addition, it is obvious to have an effect allowing the yellow inside the lighting apparatus to decrease similarly without metallic luster by printing white paint on the lens in place of the half-mirror film.

A usual lens having an allowed thickness may be used for the lens, whereas a lens having a Fresnel lens surface may be used entirely. Various any structures or modifications can be achieved by selecting an area ratio between a usual lens part and a Fresnel lens part optionally, changing a lens characteristic such as focal distances of both the usual and Fresnel lenses (thereby, for example, in an illumination scope having a degree of brightness, a spot illumination region having a further higher brightness is obtained, or a portion of aberration of the lens can be corrected slightly), inclining either one or both of central axes of the usual lens and the Fresnel lens, forming the Fresnel lens surface on a convex or concave surface without a flat surface or adopting a combination different from that of the characteristics in the above-mentioned embodiments and the like. Moreover, a scattered illumination light can be obtained by forming at least one of the lens surfaces as a concave lens.

According to the lighting apparatus of present invention, because the color or structure inside the lighting apparatus can not be seen completely through it, there is an advantageous effect on design that an outer appearance of an instrument and the like in which the lighting apparatus is installed, is not damaged, in addition, because the lighting apparatus has a structure capable of thinning or diversifying the light-focusing or light scattering characteristic, a much broader range of application such as an application to a high class article, and a very broader applicability in industrial.

What is claimed is:

1. A lighting apparatus comprising:
   a support;
   a light source disposed in the support and having an emission surface;
   a lens disposed to face the emission surface of the light source; and
   a half-mirror film provided on at least one surface of the lens, said film being constructed and configured so that the inside of the lighting apparatus cannot be seen from the outside when light is not being emitted from the light source.

2. The lighting apparatus according to claim 1, wherein the half-mirror film is provided on the whole of the at least one surface of the lens.

3. The lighting apparatus according to claim 1, wherein the half-mirror film is formed on a flat surface of the lens facing the emission surface of the light source.

4. The lighting apparatus according to claim 1, wherein the half-mirror film comprises a thin film made of a metallic material.

5. The lighting apparatus according to claim 4, wherein the half-mirror film comprises a thin film made of aluminum.

6. The lighting apparatus according to claim 1, wherein the light source is mounted on a substrate fixed to the support.

7. The lighting apparatus according to claim 1, wherein the light source comprises at least one LED.

8. The lighting apparatus according to claim 7, wherein the light source comprises a plurality of LEDs which are adapted to emit light of same or different colors with respect to each other.

9. The lighting apparatus according to claim 1, wherein the light source is encapsulated by a sealing member made of a transparent resin containing a YAG fluorescent material, and wherein the light source comprises least one blue light-emitting diode and is adapted to emit white light to the outside through the sealing member.

10. The lighting apparatus according to claim 1, wherein the lens is a light-focusing lens, the light-focusing lens has a peripheral part and a central part, the peripheral part includes a lens surface comprising a smoothly curved surface, and the central part includes a Fresnel lens surface.

11. The lighting apparatus according to claim 10, wherein a central axis of the Fresnel lens surface and a focal position of the lens comprising the smoothly curved surface are disposed in different positions.

12. The lighting apparatus according to claim 1, wherein the half-mirror film acts as a semi-transparent reflecting film.

13. The lighting apparatus according to claim 1, wherein the half-mirror film has a reflectance of 30-35%.

14. A lighting apparatus, comprising:

a support;

a plurality of LEDs disposed in the support and arranged in a planar state and each thereof having an emission surface;

a plurality of lenses, each thereof being disposed to face the emission surface of each of the LEDs; and a half-mirror film provided on at least one surface of the lenses, each of the lenses having a peripheral part and a central part, the peripheral part including a lens surface comprising a smoothly curved surface, and the central part including a Fresnel lens surface.

15. The lighting apparatus according to claim 14, wherein the light source comprises at least one LED.

* * * * *